United States Patent
Yang et al.

(10) Patent No.: US 8,592,306 B2
(45) Date of Patent: Nov. 26, 2013

(54) REDUNDANT METAL BARRIER STRUCTURE FOR INTERCONNECT APPLICATIONS

(75) Inventors: Chih-Chao Yang, Glenmont, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/529,389

(22) Filed: Jun. 21, 2012

(65) Prior Publication Data

US 2012/0264292 A1     Oct. 18, 2012

Related U.S. Application Data

(62) Division of application No. 12/468,478, filed on May 19, 2009, now Pat. No. 8,242,600.

(51) Int. Cl.
*H01L 21/768* (2006.01)
(52) U.S. Cl.
USPC .... 438/653; 438/643; 257/751; 257/E23.145; 257/E21.584

(58) Field of Classification Search
None
See application file for complete search history.

(56) References Cited

U.S. PATENT DOCUMENTS

| | | | |
|---|---|---|---|
| 5,221,449 | A | 6/1993 | Colgan et al. |
| 5,281,485 | A | 1/1994 | Colgan et al. |
| 5,930,669 | A | 7/1999 | Uzoh |
| 6,037,256 | A | 3/2000 | Weinrich et al. |
| 6,259,160 | B1 | 7/2001 | Lopatin et al. |
| 6,291,885 | B1 | 9/2001 | Cabral, Jr. et al. |
| 6,355,153 | B1 | 3/2002 | Uzoh et al. |
| 6,429,519 | B1 | 8/2002 | Uzoh |
| 6,437,440 | B1 | 8/2002 | Cabral, Jr. et al. |
| 6,441,492 | B1 | 8/2002 | Cunningham |
| 6,539,625 | B2 | 4/2003 | Engel et al. |
| 6,689,684 | B1 | 2/2004 | You et al. |
| 6,699,769 | B2 | 3/2004 | Song et al. |
| 6,844,261 | B2 | 1/2005 | Marsh et al. |
| 6,861,355 | B2 | 3/2005 | Marsh |
| 6,965,140 | B2 | 11/2005 | Kumagai et al. |
| 6,992,390 | B2 | 1/2006 | Edelstein et al. |

(Continued)

FOREIGN PATENT DOCUMENTS

| | | |
|---|---|---|
| CN | 1484856 | 3/2004 |
| CN | 101038907 | 9/2007 |
| CN | 101278396 | 10/2008 |

OTHER PUBLICATIONS

Edelstein, D. et al., "A High Performance Liner For Copper Damascene Interconnects," Conference: Proceedings of the IEEE 2001 International Interconnect Technology Conference, Jun. 4-6, 2001, pp. 9-11, IEEE, Piscataway, NJ. Abstract only.

(Continued)

*Primary Examiner* — Mamadou Diallo
(74) *Attorney, Agent, or Firm* — Scully, Scott, Murphy & Presser, P.C.; Daniel P. Morris, Esq.

(57) ABSTRACT

A redundant metal diffusion barrier is provided for an interconnect structure which improves the reliability and extendibility of the interconnect structure. The redundant metal diffusion barrier layer is located within an opening that is located within a dielectric material and it is between a diffusion barrier layer and a conductive material which are also present within the opening. The redundant diffusion barrier includes a single layered or multilayered structure comprising Ru and a Co-containing material including pure Co or a Co alloy including at least one of N, B and P.

18 Claims, 6 Drawing Sheets

(56) References Cited

U.S. PATENT DOCUMENTS

| | | |
|---|---|---|
| 7,008,871 B2 | 3/2006 | Andricacos et al. |
| 7,190,079 B2 | 3/2007 | Andricacos et al. |
| 7,193,327 B2 | 3/2007 | Yu et al. |
| 7,247,554 B2 | 7/2007 | Chyan et al. |
| 7,253,103 B2 | 8/2007 | Iwasaki et al. |
| 7,279,411 B2 | 10/2007 | Agarwala et al. |
| 2005/0085031 A1 | 4/2005 | Lopatin et al. |
| 2005/0098897 A1 | 5/2005 | Edelstein et al. |
| 2006/0113675 A1 | 6/2006 | Chang et al. |
| 2007/0111497 A1 | 5/2007 | Agarwala et al. |
| 2007/0205515 A1 | 9/2007 | Agarwala et al. |
| 2008/0054464 A1 | 3/2008 | Ikeda et al. |
| 2008/0237859 A1 | 10/2008 | Ishizaka et al. |
| 2009/0152736 A1 | 6/2009 | Watanabe et al. |

OTHER PUBLICATIONS

Edelstein, D., et al., "An Optimal Liner For Copper Damascene Interconnects," Conference: Advanced Metallization (AMC) Conference 2001 and the Advanced Metallization Conference-Asia (ADMETA) 2001, Oct. 8-11, 2001, pp. 541-547, Materials Research Society, Warrendale, PA, Abstract only.

Letter from IBM China which indicates that the date of the issued Office Action is Jun. 26, 2013.

REDUNDANT METAL BARRIER STRUCTURE FOR INTERCONNECT APPLICATIONS

RELATED APPLICATION

This application is a divisional of U.S. Ser. No. 12/468,478, filed May 19, 2009, the entire contents of which are incorporated herein by reference.

FIELD OF THE INVENTION

The present invention relates to a semiconductor structure and a method of fabricating the same. More particularly, the present invention relates to a redundant barrier structure for interconnect applications and a method of fabricating the same. The inventive structure can be used in a middle-of-the-line interconnect application or a back-end-of-the-line (BEOL) interconnect application.

BACKGROUND OF THE INVENTION

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, -based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In some interconnect structures, a diffusion barrier including TaN and Ta is employed. Such interconnect structures including a TaN/Ta diffusion barrier have good oxidation resistance properties. In yet other interconnect structures, a diffusion barrier that includes TaN and Ru has been proposed. One reason for using a diffusion barrier that includes TaN and Ru is that thin Cu seed layers (having a thickness of less than 300 Å) have better wettability on Ru than on Ta. Ru is compatible for thin Cu seed related applications, but not Ta. Thin Cu seed related applications are the trend for future technology and are closely related to technology extendibility. Also, Ru can be deposited through plasma vapor deposition (PVD), chemical vapor deposition (CVD) and atomic layer deposition (ALD), but Ta can only be deposited through PVD, which has a big technology extendibility concern on conformality. The use of a TaN/Ru diffusion barrier however is problematic since Ru as the outer diffusion barrier is not a good oxidation resistance barrier.

In view of the above, there is an ongoing need for providing an interconnect structure that includes a diffusion barrier structure in which Ru is used and the problem associated with Ru oxidation has been obviated.

SUMMARY OF THE INVENTION

The invention provides a redundant metal diffusion barrier for use in an interconnect structure which improves the reliability and extendibility of the interconnect structure. The redundant metal diffusion barrier layer is located within an opening that is located within a dielectric material. Specifically, the redundant metal diffusion barrier layer is located between a diffusion barrier layer and a conductive material which are also present within the opening. The redundant diffusion barrier layer includes a single layered or multilayered structure comprising Ru and a Co-containing material including pure Co or a Co alloy including at least one of N, B and P.

In general terms, the present invention provides a semiconductor structure that includes:
a dielectric material having a dielectric constant of about 4.0 or less located above a substrate, the dielectric material having at least one opening located therein;
a diffusion barrier located within the at least one opening;
a redundant diffusion barrier layer comprising Ru and a Co-containing material located on the diffusion barrier within the at least one opening; and
a conductive material located atop the redundant diffusion barrier layer within the at least one opening, wherein the diffusion barrier, the redundant diffusion barrier layer, and the conductive material each has an upper surface that is co-planar to an upper surface of the dielectric material.

The Co-containing material of the redundant diffusion barrier layer can be pure Co or a Co alloy including one of N, P and B.

In some embodiments of the invention, the redundant diffusion barrier layer is a bilayer structure comprising a top layer of Ru and a bottom layer comprising at least the Co-containing material. In yet other embodiments of the invention, the redundant diffusion barrier layer is a single layered structure including a gradient concentration of Ru which increases from a lower Co-containing surface upwards. In yet still other embodiments of the invention, the redundant diffusion barrier layer is a multilayered structure including more than two alternating Ru and Co-containing layers.

In addition to providing the semiconductor structure mentioned above, the present invention also provides a method of fabricating the same. In general terms, the method of the invention includes:
providing a dielectric material having a dielectric constant of about 4.0 or less above a substrate, the dielectric material having at least one opening located therein;
forming a diffusion barrier within the at least one opening;
forming a redundant diffusion barrier layer comprising Ru and a Co-containing material on the diffusion barrier within the at least one opening;
filling the remaining portion of the at least one opening with a conductive material, and
planarizing the diffusion barrier, the redundant diffusion barrier layer, and the conductive material to provide a structure in which the diffusion barrier, redundant diffusion barrier layer and the conductive material each has an upper surface that is co-planar to an upper surface of the dielectric material.

The Co-containing material of the redundant diffusion barrier layer can be pure Co or a Co alloy including one of N, P and B.

In some embodiments of the invention, the redundant diffusion barrier layer is a bilayer structure comprising a top layer of Ru and a bottom layer comprising at least the Co-containing material. In yet other embodiments of the invention, the redundant diffusion barrier layer is a single layered structure including a gradient concentration of Ru which increases from a lower Co-containing surface upwards. In yet still other embodiments of the invention, the redundant diffusion barrier layer is a multilayered structure including more than two alternating Ru and Co-containing layers.

The redundant diffusion barrier layer of the present invention can be formed utilizing physical vapor deposition (PVD), chemical vapor deposition (CVD) or atomic layer deposition (ALD). When PVD is employed, a co-sputtering process including a Ru target and a Co-containing material target is employed. When CVD or ALD is employed, a Ru-containing precursor and a Co-containing material's precursor are employed.

DETAILED DESCRIPTION OF THE INVENTION

Figure 1:
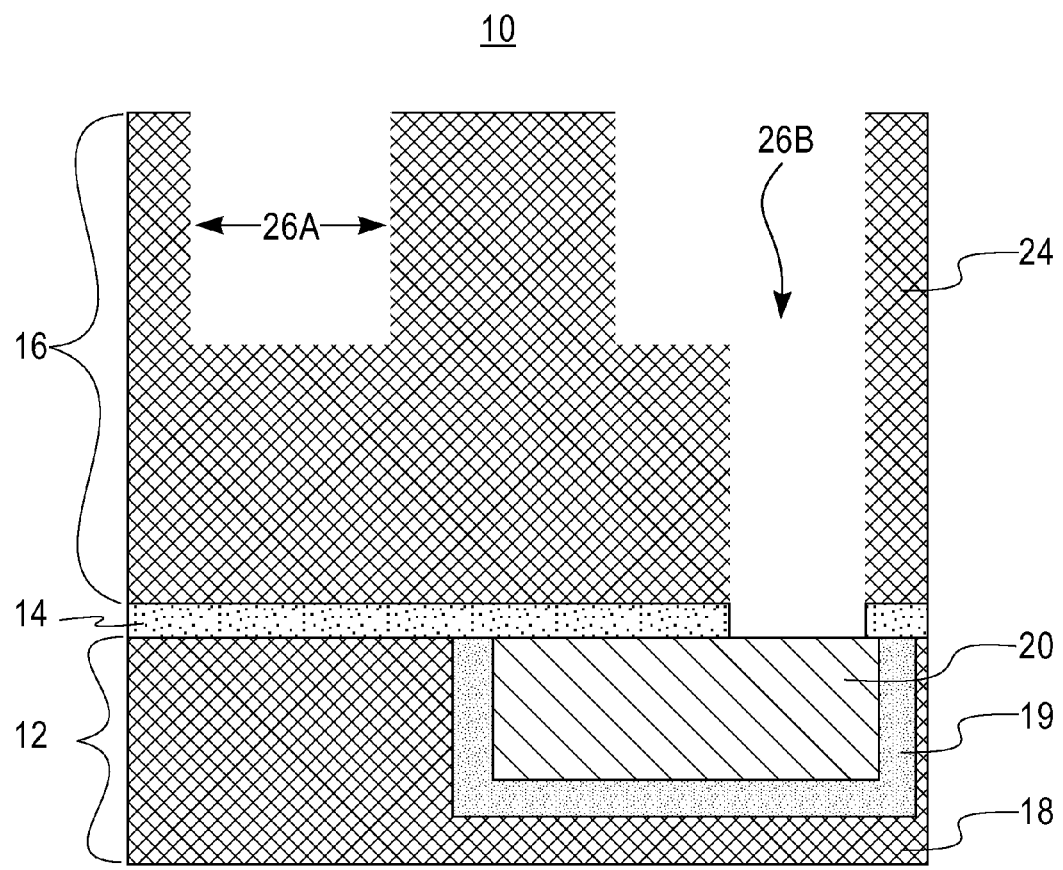
FIG. 1 is a pictorial representation (through a cross sectional view) depicting an initial structure that can be employed in the present invention.

The present invention, which provides a redundant metal barrier structure for interconnect applications and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a redundant metal diffusion barrier for use in an interconnect structure which improves the reliability and extendibility of the interconnect structure. The redundant metal diffusion barrier layer is located within an opening that is located within a dielectric material and the redundant metal diffusion barrier layer is located between a diffusion barrier layer and a conductive material which are also present within the opening. The redundant diffusion barrier includes a single layered or multilayered structure comprising Ru and a Co-containing material including pure Co or a Co alloy including at least one of N, B and P.

In general terms, the present invention provides a semiconductor structure that includes a dielectric material having a dielectric constant of about 4.0 or less located above a substrate. The dielectric material has at least one opening located therein. A diffusion barrier, a redundant diffusion barrier layer, and a conductive material are located within the at least one opening. The redundant diffusion barrier layer comprises Ru and a Co-containing material. In the inventive structure, the diffusion barrier, the redundant diffusion barrier layer, and the conductive material each has an upper surface that is co-planar to an upper surface of the dielectric material.

The process flow of the present invention begins with providing the initial interconnect structure 10 shown in FIG. 1. Specifically, the initial interconnect structure 10 shown in FIG. 1 comprises a multilevel interconnect including a lower interconnect level 12 and an upper interconnect level 16 that are separated in part by a dielectric capping layer 14. The lower interconnect level 12, which may be located above a semiconductor substrate (not shown) including one or more semiconductor devices, comprises a first dielectric material 18 having at least one conductive feature (i.e., a conductive region) 20 that is separated from the first dielectric layer 18 by a barrier layer 19. The upper interconnect level 16 comprises a second dielectric material 24 that has at least one opening located therein. The at least one opening may be a via opening, a line opening, a combined via/line opening, or any combination thereof. As is shown in the illustrated embodiment, a line opening 26A and a combined via/line opening 26B are present within the second dielectric material 24. The combined via/line opening 26B exposes a portion of the conductive feature 20 that is present within the lower interconnect level 12.

The initial structure 10 shown in FIG. 1 is made utilizing conventional techniques well known to those skilled in the art. For example, the initial interconnect structure 10 can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, an alloy of at least one elemental metal, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous, with porous dielectrics having a dielectric constant of about 2.8 or less being highly preferred in some embodiments of the present invention. Some examples of suitable dielectrics that can be used as the first dielectric material 18 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from 200 to 450 nm.

The lower interconnect level 12 also has at least one conductive feature 20 that is embedded in (i.e., located within) the first dielectric material 18. The at least one conductive feature 20 comprises a conductive material that is separated from the first dielectric material 18 by a barrier layer 19. The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer 19 and then with a conductive material forming the conductive region. The barrier layer 19, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 19 may vary depending on the exact means of the deposition process as well as the material employed. Typically, the barrier layer 19 has a thickness from 4 to 40 nm, with a thickness from 7 to 20 nm being more typical.

Following the barrier layer formation, the remaining region of the opening within the first dielectric material 18 is filled with a conductive material forming the conductive feature 20. The conductive material used in forming the conductive feature 20 includes, for example, polySi, a conductive metal, an alloy comprising at least one conductive metal, a conductive metal silicide or combinations thereof. Preferably, the conductive material that is used in forming the conductive feature 20 is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to CVD, PECVD, sputtering, chemical solution deposition or plating. After deposition, a conventional planarization process such as, for example, chemical mechanical polishing (CMP) can be used to provide a structure in which the barrier layer 19 and the conductive feature 20 each have an upper surface that is substantially coplanar with the upper surface of the first dielectric material 18.

After forming the at least one conductive feature 20, a blanket dielectric capping layer 14 is formed on the surface of the lower interconnect level 12 utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the capping layer 14 may vary depending on the technique used to form the same as well as the material make-up of the layer. Typically, the capping layer 14 has a thickness from 15 to 55 nm, with a thickness from 25 to 45 nm being more typical.

Next, the upper interconnect level 16 is formed by applying the second dielectric material 24 to the upper exposed surface of the capping layer 14. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. The second dielectric material 24 can also comprise two different materials, i.e., deposition of one dielectric material first, followed by deposition of a different dielectric material. In one embodiment of the present invention, the second dielectric material 24 comprises two different low k dielectric materials and thus the upper interconnect level 16 has a hybrid structure with the subsequently filled conductively filled line embedded in a porous dielectric material, and the subsequently filled via embedded in a dense (i.e., non porous) dielectric material. In such an embodiment, the porous low k dielectric has a dielectric constant of about 2.8 or less, and the dense porous low k dielectric has a dielectric constant of about 4.0 or less.

Next, at least one opening is formed into the second dielectric material 24 by first forming a blanket hard mask material (not shown) atop the upper surface of the second dielectric material 24. The blanket hard mask material includes an oxide, nitride, oxynitride or any combination including multilayers thereof. Typically, the hard mask material is an oxide such as $SiO_2$ or a nitride such as $Si_3N_4$. The blanket hard mask material is formed utilizing a conventional deposition process such as, for example, CVD, PECVD, chemical solution deposition or evaporation. The thickness of the as-deposited hard mask material may vary depending upon the type of hard mask material formed, the number of layers that make up the hard mask material and the deposition technique used in forming the same. Typically, the as-deposited hard mask material has a thickness from 10 to 80 nm, with a thickness from 20 to 60 nm being even more typical.

After forming the blanket layer of hard mask material, a photoresist (not shown) is formed atop the hard mask material utilizing a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the hard mask material that defines the width of the opening. A via opening and/or a line opening can be formed utilizing a lithographic and etching. When a combined via/line opening is formed, another iteration of lithography and etching is used in forming the same. It is noted that during the etching of the combined via/line opening some portion of the dielectric capping layer 14 is removed.

As stated above, the at least one opening may comprise a line opening, a via opening, a combined via/line opening or any combination thereof. By way of illustration, a line opening 26A and a combined via/line 26B are shown.

Following the formation of the at least one opening into the second dielectric material, the hard mask located atop the second dielectric material is typically removed from the structure. The removal of the hard mask may occur before or after filling the at least one opening with a conductive material. In the embodiment illustrated, the hard mask is removed after forming the at least one opening.

Figure 2:
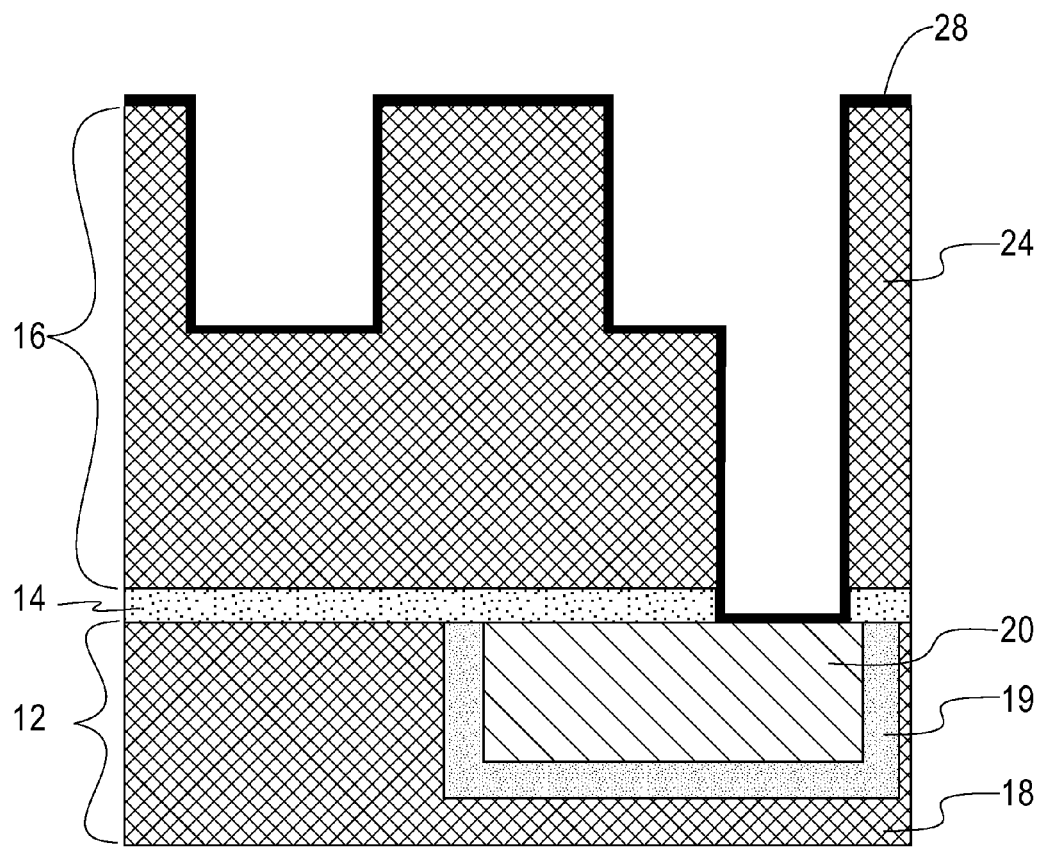
FIG. 2 is a pictorial representation (through a cross sectional view) depicting the structure that is formed after forming a diffusion barrier on the exposed surface of the initial structure shown in FIG. 1.

FIG. 2 shows the structure after forming a diffusion barrier 28 on at least the exposed wall portions of the second dielectric material 24 within the at least one opening. The diffusion barrier 28 comprises one of Ta, TaN, TiN, Ru, RuN, RuTa, RuTaN, W, WN and any other material that can serve as a barrier to prevent conductive material from diffusing there through. The thickness of the diffusion barrier 28 may vary depending on the deposition process used in forming the same as well as the material employed. Typically, the diffusion barrier 28 has a thickness from 4 to 40 nm, with a thickness from 7 to 20 nm being more typical. The diffusion barrier 28 is formed by a conventional deposition process including, for example, CVD, PECVD, atomic layer deposition (ALD), physical vapor deposition (PVD), sputtering, chemical solution deposition and plating.

After forming the diffusion barrier 28 within the at least one opening, a redundant diffusion barrier layer 30 is formed atop the diffusion barrier 28. The structure including the redundant diffusion barrier layer 30 is shown, for example, in FIG. 3. The redundant diffusion barrier layer 30 employed in the present invention comprises Ru and a Co-containing material. The Co-containing material may be pure Co or a Co alloy including at least one of N, P and B.

The redundant diffusion barrier layer 30 of the present invention can be formed utilizing physical vapor deposition (PVD), chemical vapor deposition (CVD) or atomic layer deposition (ALD). When PVD is employed, a co-sputtering process including a Ru target and a Co-containing material target is employed. When CVD or ALD is employed, a Ru-containing precursor and a Co-containing material's precursor are employed. The conditions for PVD, CVD and ALD are well known to those skilled in the art. Typically, the formation of the redundant diffusion barrier layer 30 is performed at a deposition temperature of 100° C. or greater, with a deposition temperature from 150° C. to 350° C. being even more typical. Also the formation of the redundant diffusion barrier layer 30 is performed at a deposition pressure of 5 mTorr or greater, with a deposition pressure from 50 to 0.1 mTorr being even more typical.

The thickness of the redundant diffusion barrier layer 30 may vary depending on the technique used in forming the same. Typically, the redundant diffusion barrier layer 30 has a thickness from 1 to 10 nm, with a thickness from 2 to 5 nm being more preferred.

Figure 4A:
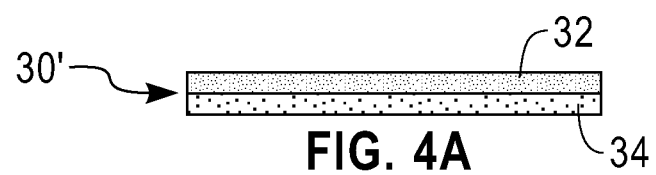
FIGS. 4A-4C are pictorial representations (through cross sectional views) depicting various redundant diffusion barrier layers that can be employed in the structure illustrated in FIG. 3.
Figure 4B:
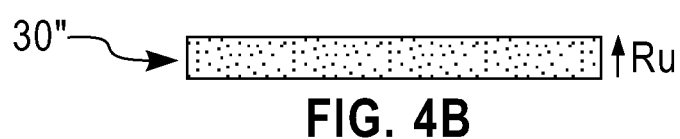
Figure 4C:
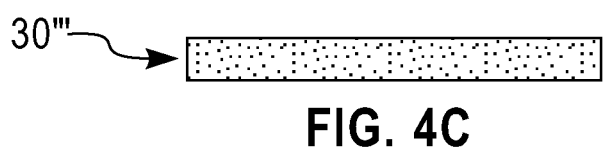

FIGS. 4A-4C illustrate various types of redundant diffusion barrier layers that can be employed in the present invention. Specifically, FIG. 4A illustrates a redundant diffusion barrier 30' that includes a bilayer structure comprising a top layer 32 of Ru and a bottom layer 34 comprising at least Co. FIG. 4B illustrates a redundant diffusion barrier 30" that includes a single layered structure including a gradient concentration of Ru which increases from a lower Co-containing surface upwards. FIG. 4C illustrates a redundant diffusion barrier layer 30'" that includes a multilayered structure including more than two alternating Ru and Co-containing layers; in the multilayered structure a Co-containing layer is located beneath a Ru-containing layer.

Figure 3:
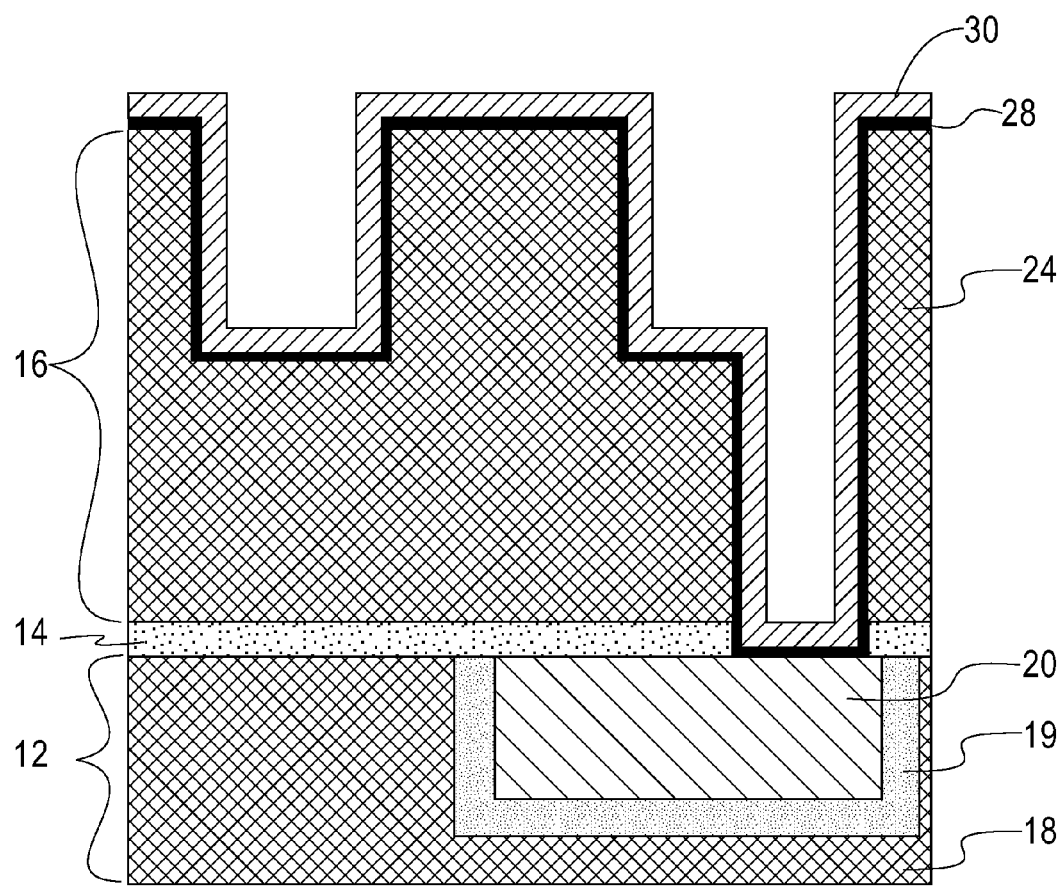
FIG. 3 is a pictorial representation (through a cross sectional view) depicting the structure that is formed after forming a redundant diffusion barrier layer that comprises Ru and a Co-containing material on the structure shown in FIG. 2.
Figure 5:
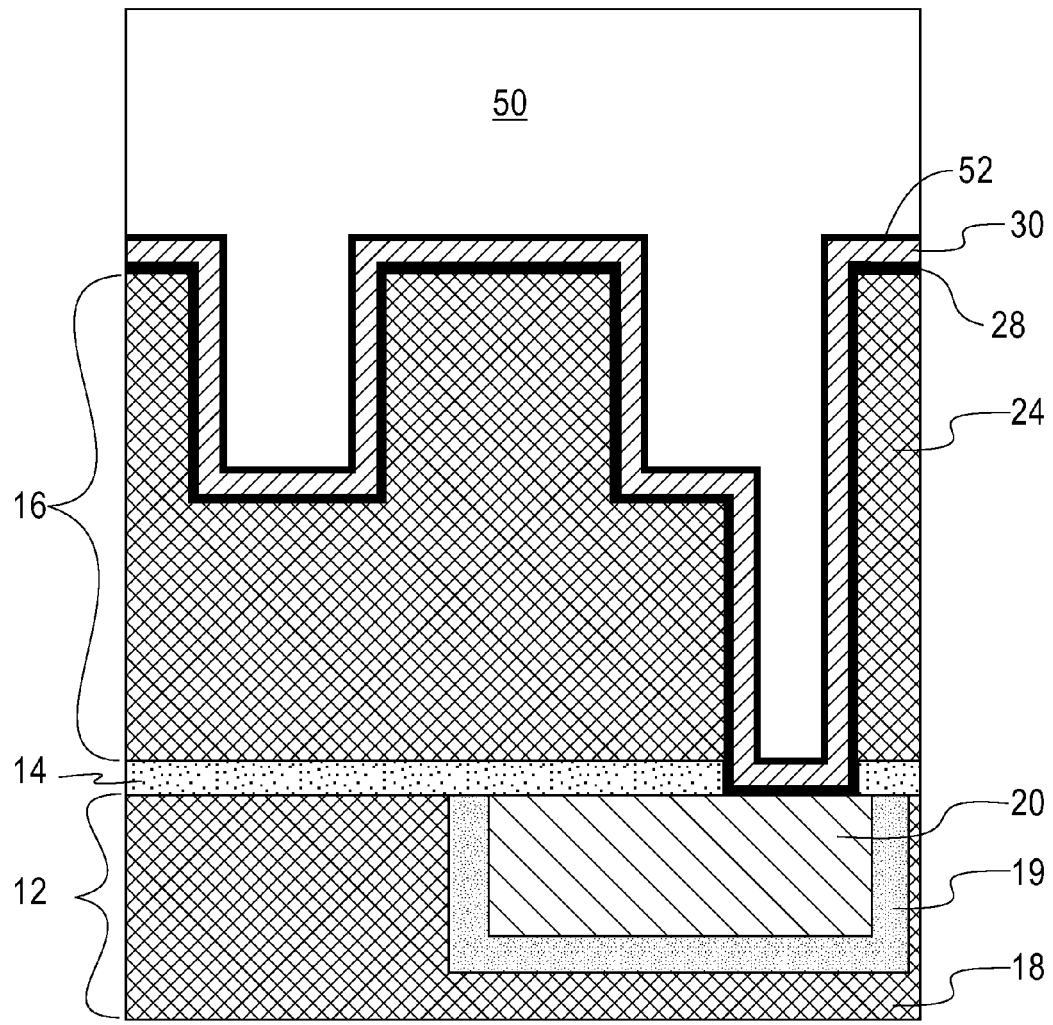
FIG. 5 is a pictorial representation (through a cross sectional view) depicting the structure that is formed after forming an optional seed layer and a conductive material on the structure shown in FIG. 3.

After providing the structure shown in FIG. 3, the at least one opening is filled with a conductive material 50 to provide the structure shown in FIG. 5. In some embodiments, an adhesion/plating seed layer 52 is employed.

When present, the adhesion/plating seed layer 52 is comprised of a metal or metal alloy from Group VIIIA of the Periodic Table of Elements. Examples of suitable Group VIIIA elements for the adhesion/plating seed layer 52 include, but are not limited to Ru, TaRu, Ir, Rh, Pt, Pd and alloys thereof. In some embodiments, it is preferred to use Ru, Ir or Rh as the optional plating/adhesion seed layer 52. The optional adhesion/plating seed layer 52 can also be pure Cu or Cu alloy, including Cu(Al), Cu(Ir), and Cu(Ru). The optional adhesion/plating seed layer 52 is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the optional adhesion/plating seed layer 52 may vary depending on number of factors including, for example, the compositional material of the adhesion/plating seed layer 52 and the technique that was used in forming the same. Typically, the optional adhesion/plating seed layer 52 has a thickness from 0.5 to 10 nm, with a thickness of less than 6 nm being even more typical.

The conductive material 50 which used in forming a conductive feature embedded within the second dielectric material 24 includes, for example, polySi, a conductive metal, an alloy comprising at least one conductive metal, a conductive metal silicide or combinations thereof. Preferably, the conductive material 50 that is used in forming the conductive feature is a conductive metal such as Cu, W or Al, with Cu or a Cu alloy (such as AlCu) being highly preferred in the present invention. The conductive material 50 is filled into the remaining at least one opening in the second dielectric material 24 utilizing a conventional deposition process including, but not limited to CVD, PECVD, sputtering, chemical solution deposition or plating.

Figure 6:
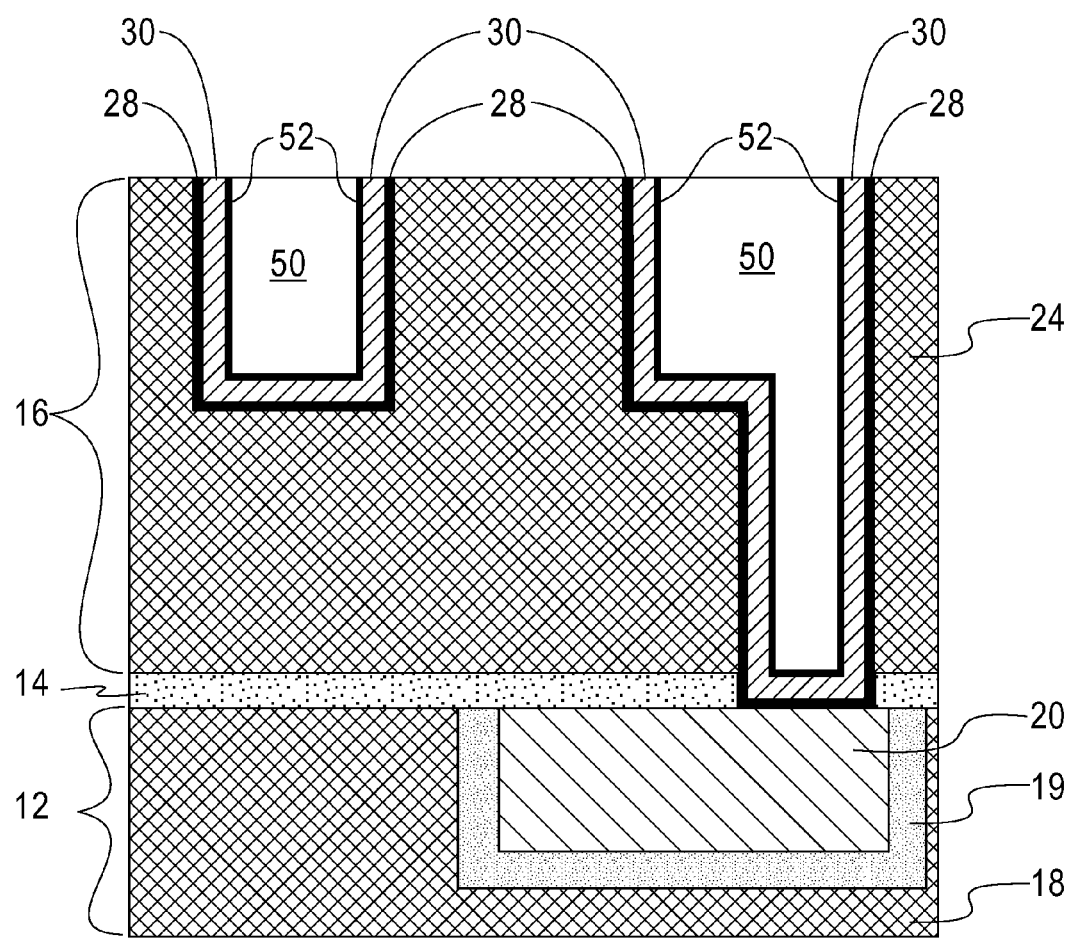
FIG. 6 is a pictorial representation (through a cross sectional view) depicting the structure that is formed after planarizing the structure shown in FIG. 5.

After deposition, a conventional planarization process such as, for example, chemical mechanical polishing (CMP) and/or grinding can be used to provide a structure in which the diffusion barrier 28, the redundant diffusion barrier 30, and the conductive material 50 each has an upper surface that is substantially coplanar with (e.g. to) the upper surface of the second dielectric material 24. Such a structure is shown, for example, in FIG. 6. Specifically, the structure shown in FIG. 6 includes a dielectric material (i.e., second dielectric material 24) having a dielectric constant of about 4.0 or less located above a substrate (not specifically labeled). The dielectric material (i.e., second dielectric material 24) has at least one opening (i.e., line opening 26A and combined line/via opening 26B) located therein. A diffusion barrier 28, a redundant diffusion barrier layer 30, and a conductive material 50 are located within the at least one opening. The redundant diffusion barrier layer 30 comprises Ru and a Co-containing material. In the inventive structure, the diffusion barrier 28, the redundant diffusion barrier layer 30, and the conductive material 50 each has an upper surface that is co-planar to an upper surface of the dielectric material (e.g., second dielectric material 24).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
    providing a dielectric material having a dielectric constant of about 4.0 or less located above a substrate, the dielectric material having at least one opening located therein;
    forming a diffusion barrier within the at least one opening;
    forming a redundant diffusion barrier layer on the diffusion barrier within the at least one opening, wherein said redundant diffusion barrier layer is a bilayer structure comprising a top layer of Ru and a bottom layer comprising at least a Co-containing material;
    filling the remaining portion of the at least one opening with a conductive material; and
    planarizing the diffusion barrier, the redundant diffusion barrier layer, and the conductive material to provide a structure in which the diffusion barrier, redundant diffusion barrier layer and the conductive material each has an upper surface that is co-planar to an upper surface of the dielectric material.

2. The method of claim 1 further comprising forming a lower interconnect level located beneath an upper interconnect level including said structure, wherein the lower interconnect level and the upper interconnect level are spaced apart in part by a dielectric capping layer.

3. The method of claim 1 wherein said Co-containing material is pure Co.

4. The method of claim 1 wherein said Co-containing material is a Co alloy including one of N, P and B.

5. The method of claim 1 wherein said conductive material comprises W or Al.

6. The method of claim 1 wherein said conductive material comprises Cu or a Cu alloy.

7. The method of claim 1 wherein said redundant diffusion barrier layer is formed utilizing physical vapor deposition (PVD), said PVD includes a co-sputtering process in which a Ru target and a Co-containing material target are employed.

8. The method of claim 1 wherein said redundant diffusion barrier layer is formed utilizing one of chemical vapor deposition (CVD) and atomic layer deposition (ALD), wherein said CVD and/or ALD include a Ru-containing precursor and a Co-containing material's precursor.

9. The method of claim 1 wherein said forming said redundant diffusion barrier layer comprises forming a contiguous redundant diffusion barrier layer on said diffusion barrier.

10. The method of claim 1 wherein said forming the redundant diffusion barrier layer is performed at a temperature from 150° C. to 350° C.

11. The method of claim 1 wherein said forming the diffusion barrier comprises selecting one of Ta, TaN, TiN, Ru, RuN, RuTa, RuTaN, W or WN as a material for said diffusion barrier.

12. The method of claim 1 wherein a portion of said diffusion barrier located at a bottom portion of said at least one opening separates said redundant diffusion barrier layer from an underlying conductive feature present in another dielectric material.

13. The method of claim 1 wherein said at least one opening is a line or via.

14. The method of claim 1 wherein said at least one opening is a combined via and line.

15. The method of claim 1 wherein no portion of said redundant diffusion barrier layer contacts said dielectric material.

16. The method of claim 1 wherein no portion of said conductive material contacts said diffusion barrier.

17. A method of forming a semiconductor structure comprising:
    providing a dielectric material having a dielectric constant of about 4.0 or less located above a substrate, the dielectric material having at least one opening located therein;
    forming a diffusion barrier within the at least one opening;
    forming a redundant diffusion barrier layer on the diffusion barrier within the at least one opening, wherein said redundant diffusion barrier layer is a single layered structure including a gradient concentration of Ru which increases from a lower Co-containing surface upperwards;
    filling the remaining portion of the at least one opening with a conductive material; and
    planarizing the diffusion barrier, the redundant diffusion barrier layer, and the conductive material to provide a structure in which the diffusion barrier, redundant diffusion barrier layer and the conductive material each has an upper surface that is co-planar to an upper surface of the dielectric material.

18. A method of forming a semiconductor structure comprising:
    providing a dielectric material having a dielectric constant of about 4.0 or less located above a substrate, the dielectric material having at least one opening located therein;
    forming a diffusion barrier within the at least one opening;
    forming a redundant diffusion barrier layer on the diffusion barrier within the at least one opening, wherein said redundant diffusion barrier layer is a multilayered structure including more than two alternating Ru and Co-containing layers;
    filling the remaining portion of the at least one opening with a conductive material; and
    planarizing the diffusion barrier, the redundant diffusion barrier layer, and the conductive material to provide a structure in which the diffusion barrier, redundant diffusion barrier layer and the conductive material each has an upper surface that is co-planar to an upper surface of the dielectric material.

* * * * *